United States Patent [19]
Strom et al.

[11] 3,947,722
[45] Mar. 30, 1976

[54] ELECTRONIC SCAN METHODS FOR PLASMA DISPLAYS

[75] Inventors: Richard Albert Strom, Richfield; William Norman Mayer, White Bear Lake; Robert Wallace Johnson, Bloomington, all of Minn.

[73] Assignee: Control Data Corporation, Minneapolis, Minn.

[22] Filed: June 19, 1974

[21] Appl. No.: 480,644

[52] U.S. Cl. .......................... 315/169 TV; 313/201
[51] Int. Cl.² ........................................ H05B 37/00
[58] Field of Search .......... 313/201, 493, 494, 505; 315/169 TV, 169 R; 340/336

[56] References Cited
UNITED STATES PATENTS
2,923,853  2/1960  Englebart..................... 313/201 X
3,202,868  8/1965  Blank.......................... 313/169 R X

*Primary Examiner*—R. V. Rolinec
*Assistant Examiner*—Lawrence J. Dahl
*Attorney, Agent, or Firm*—Edward L. Schwarz

[57] ABSTRACT

Apparatus for changing a dimension of the light-producing area in a display element of the type which emits light from any portion of an interface zone across which a voltage exceeding a certain threshold is established, by varying this voltage. A bias voltage source provides a potential along one side of the interface zone, which increases from one end to the other, with respect to the other side. The apparatus is particularly well suited for an electronic bar graph type indicator. Gas discharge devices such as plasma tubes, and LED's are particularly suitable types of display elements.

15 Claims, 6 Drawing Figures

ELECTRONIC SCAN METHODS FOR PLASMA DISPLAYS

BACKGROUND OF THE INVENTION

1. Field of the Invention

The invention is related to visual display units whose information can be electronically altered. In particular, the invention is related to those devices which represent quantities which can conveniently be displayed in bar graph form. E.g., this invention may be employed to effectively display fluid levels, speed, temperature and other physical quantities which must be quickly and clearly discernable, but where great precision is not required.

2. Description of the Prior Art

Devices are well known which can easily be adapted to provide the same kind of display of which this invention is capable, by using a plurality of input lines, each to activate a particular segment of the device. See for example, U.S. Pat. Nos. 2,988,647; 3,671,938; 3,496,410 (MacIntyre); and 3,327,163 (Blank). These latter two patents are specifically intended to provide an electronic bar graph display, previously pointed out to be the most useful embodiment contemplated by the inventors. *Readout*, Vol. 3, No. 1, Feb./Mar. 1974, pub. Burroughs Corp., discloses another such device.

BRIEF DESCRIPTION OF THE INVENTION

This invention involves apparatus which causes a light-emitting threshold device to emit light from any segment of an interface zone across which a threshold or greater voltage exists. By "threshold device" is meant those devices which produce no discernable emission until the definite threshold voltage across any segment of its interface zone is reached. Above the threshold, emission occurs from the segment involved although brightness may vary with varying voltages above the threshold, and of course, with the device involved. The important factor is that a definite nonlinearity exists at the threshold which prevents emission below the threshold and within a relatively short voltage range causes the device to break into light emission. The invention is ideally suited to use gas discharge devices such as used in plasma display units as the light emitting threshold device, in that such a distinct threshold exists for their light emission. Another potential candidate for use as the light-emitting device is the light emitting diode.

In a typical embodiment of this invention employing a gas discharge tube to form the display element, voltage is applied to the tube between a ground plane conductor fixed adjacent one side of the gas chamber of the tube, and a conductor having appreciable distributed resistance along its length placed adjacent the gas chamber on the opposite side, both extending along at least an identical portion of the length of the chamber. A voltage source is connected to pass current through the resistive conductor, resulting in a voltage gradient along the length of the resistive conductor. The voltage may be either AC or DC, but if DC, the conductors must be physically contacting the gas mixture. Because of the voltage gradient along the resistive conductor, the voltage difference between the ground plane conductor and the resistive conductor varies from one end of the ground plane to the other. A second variable voltage source is connected between the ground plane and the resistive element, whose output in response to a control signal, can be varied to set the potential between any point on the resistive conductor and the closest point on the ground plane to the threshold value.

In operation, the control signal is set to a value which causes the threshold voltage to occur at a desired point between the two conductors. Adjacent this point, and at all points where higher voltage between the conductors along the gas chamber exists, the gas within the chamber will ionize and emit light. By varying the control signal and hence the second voltage, the threshold voltage point can be shifted to any desired point on the tube. The variable dimension of the light-emitting area provides an easily discernable analog indication of the information in the control signal. Experience shows that the transition between the light-emitting and dark areas is well-defined and its position can be accurately controlled.

In one variation on this basic apparatus the resistive conductor can be replaced with a series of spaced-apart electrodes along the original location of the resistive conductor, each connected to its neighbor(s) by a resistor or impedance. A voltage gradient may be similarly created along these electrodes, and light emitted adjacent all electrodes whose voltage relative the ground plane exceeds the threshold.

By proper selection of gas mixture and use of A.C. voltage sources for power in a gas discharge display, the voltage necessary to sustain light emission once initiated can be decreased to a level significantly below that of the threshold voltage. This allows a gas discharge display to indicate maximum value attained in any period rather than present value, by restricting the variable voltage to maintain the sustaining voltage across the entire chamber at all times. The display may be cleared by decreasing the variable voltage to below the sustain value.

Accordingly, one object of this invention is to provide a bar graph indication of the magnitude of a quantity in an electronic light-emitting threshold device with the application of a single variable control voltage.

A second object is to reduce the complexity of electronic analog indicators.

Another object is to provide an indication of the magnitude of a quantity after removal of a signal encoding that quantity.

Other objects and advantages will be apparent from the detailed description which follows.

BRIEF DESCRIPTION OF THE DRAWINGS

FIG. 1b is a graph of voltages associated with the device of FIG. 1a.

FIG. 2b is a graph of voltages associated with the circuit of FIG. 2a.

DESCRIPTION OF THE PREFERRED EMBODIMENTS

Figure 1A:
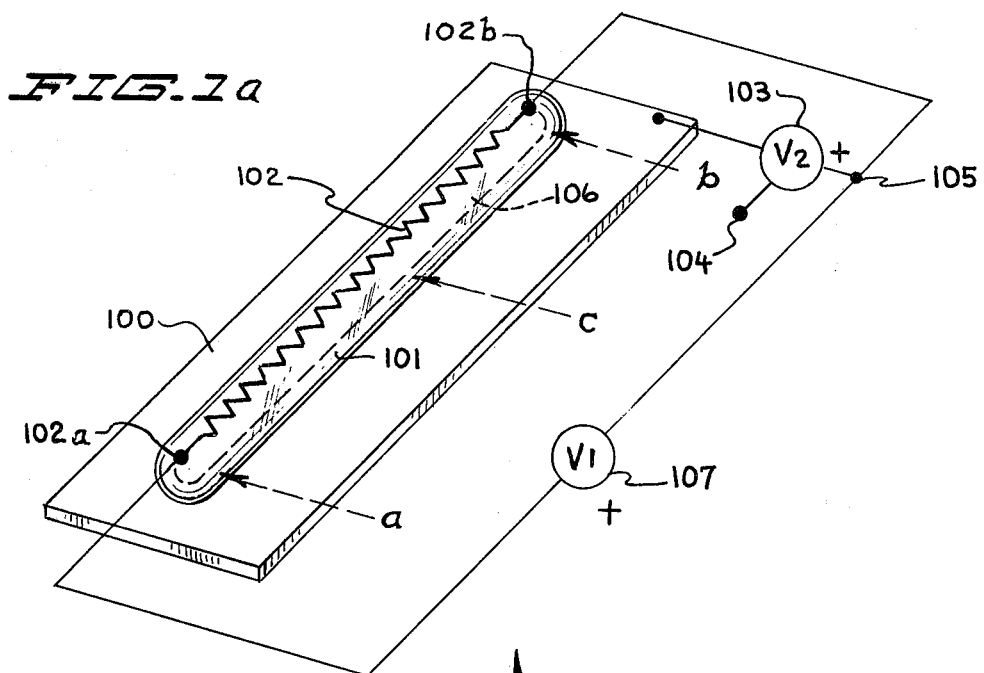
FIG. 1a is a simple embodiment of the invention incorporating a conductor having distributed resistance.

Referring to FIG. 1, an elongate gas discharge tube 101 of conventional design and having within it a gas chamber 106 containing an ionizable gas is shown with conductors 100 and 102 disposed on opposite sides of tube 101 (respectively far and near with reference to the viewer) so as to place chamber 106 substantially between them. Conductor 100 may take any of several forms, such as flat plate 100 shown contacting or adjacent the outer surface of tube 101, a highly conductive coating adhering to tube 106 along the outer surface, or a conductor placed permanently within chamber 106 adjacent its (with respect to FIG. 1) far surface. Conductor 102 is a distributed resistance extending substantially the length of gas chamber 106, and of sufficient resistance so as to, in this simple embodiment, permit current flow caused by voltage source 107 to be approximately an order of magnitude greater than maximum current flow between conductors, occurring when light is emitted from entire tube 101. Approximate current flow can be determined by application of the teachings of well-known compilations of the prior art, such as *Materials of High Vacuum Technology*, Werner Espe, pub. Pergamon Press, copr. 1968, which work is hereby made by reference a part of this description. Voltage source 107 is connected to end terminals 102a and 102b of conductor 102. Voltage source 107, as well as voltage source 103, is usually of the A.C. type, but if conductors 100 and 102 are located within gas chamber 106, may be D.C. Voltage source 107 is a fixed voltage source and for a neon-filled discharge tube six inches long may be on the order of 100 A.C. volts R.M.S. This and other voltages discussed hereafter are values of an actual experimental system. Variations in the design of tube 101 and the gas with which chamber 106 is charged, may require significant deviations from these values. 100 v. provides a voltage gradient along conductor 102 of approximately 17 volts per inch. For the good accuracy of resolution, it is desirable that this gradient be within the range of 10–20 volts per inch. Voltage source 103 is a variable voltage source whose output, assuming a threshold voltage $V_t$ of 270 v., necessary to initiate light emission in tube 101 varies between 170 v. and 270 v. A.C. responsive to a control signal to terminal 104. It is important that voltage sources 103 and 107 be synchronized so that power terminal 105 of voltage source 104 is in phase with voltage source 107 at terminal 102a.

Figure 1B:
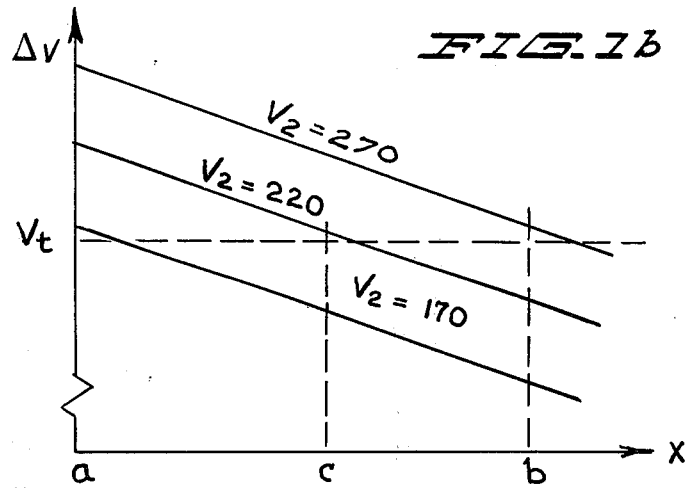

In understanding the operation of the apparatus in FIG. 1a, it is convenient to refer to the voltage graph of FIG. 1b. The abscissa represents positions along discharge tube 101 with point a being at the origin, and the ordinate being the voltage difference $\Delta V$ between the point on conductor 102 at any position on the gas tube, and conductor 100. This voltage changes as the output $V_2$ of voltage source 103 changes. As earlier mentioned, for light emisssion across any portion of the tube 101, a difference of 270 v. or greater between the conductors at that point is required. When $V_2 = 170$ v., voltage difference between conductors 102 and 100 is shown by the so-labeled line in FIG. 1b. At this point, only the gas in chamber 106 adjacent point a will be emitting light, since only at this point has the threshold voltage $V_t$ been equaled or exceeded by $\Delta V$. (The problem of piloting, or providing free electrons so as to initiate light emission in a previously completely dark tube at the specified $V_t$ will be ignored, as such expedients are well known in the art.) As the control signal applied to terminal 104 increases $V_2$, the light-emitting length of chamber 106 will extend further from point a toward point c. When $V_2 = 220$ v., $\Delta V$ along tube 101 is as shown by the line so-labeled, chamber 106 between points a and c will be between the portions of conductors 100 and 102 having at least 270 v. potential difference between them, and the entire length of chamber 106 from point a to point c will be emitting light. When $V_2$ is at its maximum of 270 volts, the entire chamber will be emitting light because the voltage difference between conductors 100 and 102 is greater than 270 v. everywhere. As a greater portion of the length of tube 101 emits light, a greater current flows from source 103. This current will change the voltage drop characteristics in conductor 102. The curves shown in FIG. 1b ignore this effect, with little effect on accuracy if current flow due to source 107 is large compared to that due to source 103, as previously specified. As current flow increases, voltage drop across that portion of conductor 102 carrying this increased current also increases, with the result that for light emission from a desired length of tube 101 somewhat more than the specified voltage from source 103 will be necessary. Thus, in actual practice, for emission from the entire length of tube 101, perhaps 290 v. may be necessary, rather than the ideal 270 v. value.

The significantly greater $\Delta V$ at point a when the threshold voltage is reached at point b, is a constraint dictating that $V_1$ be chosen as small as possible to prevent variations in brightness from point a to point b. It is advisable to select for tube 101 one having brightness relatively insensitive to differing voltage levels between conductors 100 and 102. On the other hand, it is also essential that $V_1$ be selected great enough to provide a voltage gradient along conductor 102 which results in a reasonably sharp delineation between the light-emitting area of chamber 106, and the unlit area. It has been found that the lit to unlit interface in chamber 106 occupies a space equivalent to about 1–2 v. in the usual system. Thus, 17 v. per inch will cause an imprecision or uncertainty of about 0.1 inch in the position of the light-to-dark transition. These are simply matters of engineering judgement which must be tailored to the particular application involved.

Figure 2A:
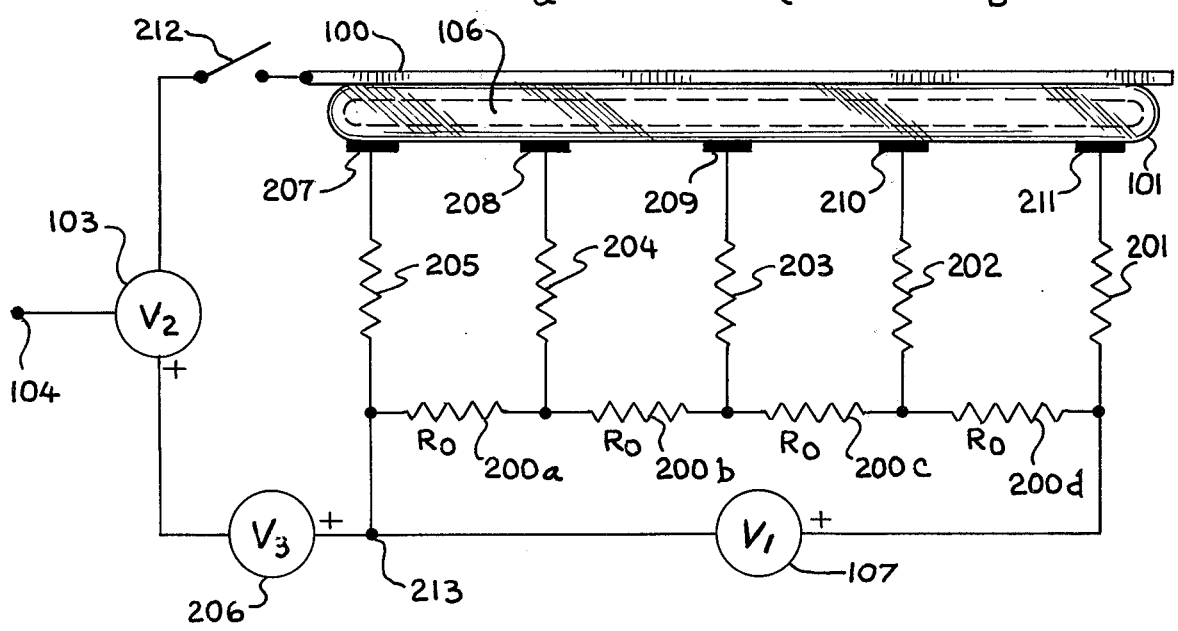
FIG. 2a is a schematic diagram of an operational embodiment which retains its indicated value after removal of the control signal.

Turning next to FIG. 2a, a different implementation of the principles explained in conjunction with FIG. 1a is shown. Like-numbered elements are identical in the two drawings. However, segments of tube 101 emit light from right to left with increasing voltage. Gas within chamber 106 is of the type having a minimum sustaining voltage $V_s$ at or above which light emission anywhere in chamber 106 will be reliably maintained, and which is appreciably lower than the threshold voltage $V_t$. For explanatory purposes, typical values of $V_s = 220$ v. and $V_t = 270$ v. will be assumed, both being A.C. or chopped D.C. generally referred to as A.C. hereafter. Selection of an appropriate gas can be done as explained by Espe, supra. Resistive conductor 102 is replaced in FIG. 2a with electrodes 207, 208, 209, 210 and 211, which are generally aligned along the same position that conductor 102 occupies in FIG. 1a, although here conductors 102 and 207–211 are shown on edge, rather than in plan view. The inherent resistance of conductor 102 is supplied instead by resistors 200a–205. Resistors 200a–200d perform the function of dropping the voltage uniformly from one to another of the various electrodes 207–211. Resistors 201–205 are intended to equalize current flow through electrodes 207–211, and are chosen such that current flow for each electrode 207–211 is approximately the same. Voltage source 103 is again controlled by a signal at terminal 104, but for the system of FIG. 2a $V_2$ varies from 0 to 50 v. and is A.C. Voltage source 206 produces a fixed A.C. output slightly greater than $V_s$, or $V_3$ = 225 v. For source 107, $V_1$ must satisfy $V_1 < V_t - V_s$. $V_1$ may thus conveniently be 40 v. A.C. All three voltage sources 103, 107, and 206 must have their + terminals in phase with each other. Switch 212 allows complete removal of voltage between conductor 100 and electrodes 207–211. Piloting can be accomplished in any convenient fashion, and will not be considered.

Figure 2B:
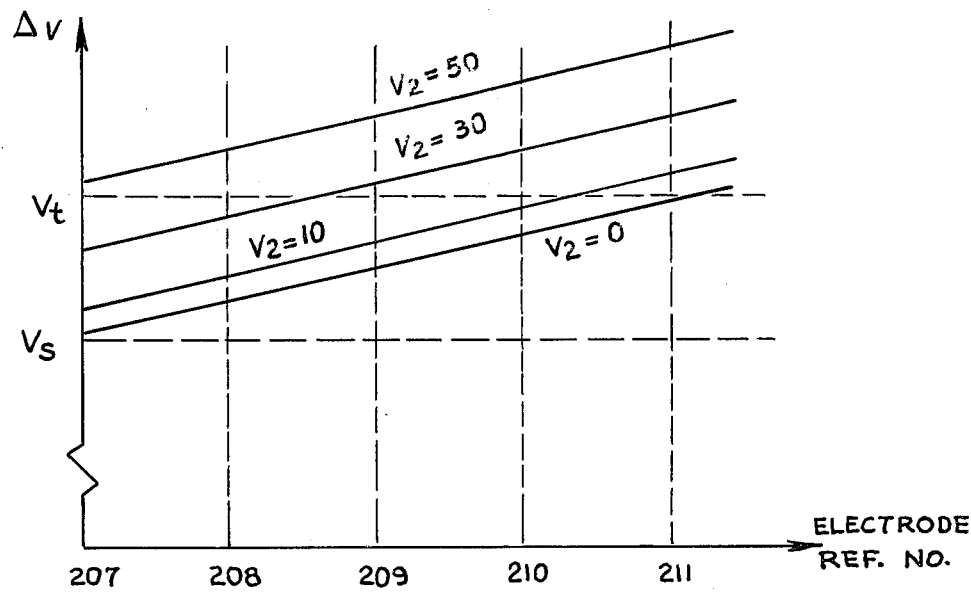

In operation, resistors 200a–200d cause the voltage from source 107 to be dropped across electrodes 207–211 in equal amounts of approximately 10 v. between each pair of adjacent electrodes 207–211. For operation, switch 212 must be closed applying the series-connected output of voltages 103 and 206 between plane 100 and electrodes 207–211. Referring to FIG. 2b, the line labeled $V_2 = 0$ illustrates the voltage between conductor 100 and each of the electrodes 207–211 when $V_2 = 0$. As can be seen, electrode 207 is slightly (5 v.) above $V_2$ and electrode 211 is at a point slightly below (5 v.) $V_t$. Electrodes 208–210 have intermediate voltages. Since all electrodes 207–211 have potentials with respect to plane 100 which are between the threshold and sustain voltages, all those which are conducting current and therefore emitting light will continue to so conduct. Conversely, those not conducting will be maintained in that status. When a signal is applied to terminal 104 the voltage across source 103 corresponding to the predetermined value of the signal is created. If, e.g. the signal on terminal 104 causes $V_2$ to equal 10 v., the condition is as shown in FIG. 2b where the potential from across electrode 211 to conductor 100 will be approximately 275 v., the potential from electrode 210 to conductor 100 will be 265 v. and potentials between electrodes 207–209 and conductor 100 will all be less than 265 v. This causes the gas in chamber 106 adjacent electrode 211 to conduct and emit light, $V_t$ having been exceeded in the neighborhood of electrode 211, but not elsewhere. If at some later time, $V_2$ is increased to 30 v. the potential with respect to conductor 100 at electrode 211 will be 295 v.; at electrode 210, 285 v.; at electrode 209, 275 v.; and below $V_t$ for electrodes 207 and 208, as is shown for the voltage line labeled $V_2 = 30$. Similarly, when $V_2$ is increased to 50 v. voltage between each of electrodes 207–211 and conductor 100 will be as shown by the line labeled $V_2 = 50$. Thus, it can be seen that starting with electrode 211, light emission adjacent as many electrodes sequentially proceding left from electrode 211 can be initiated by appropriately controlling the voltage of source 103. By setting $V_2 = 0$, whichever electrodes 207–211 are currently emitting light will continue to do so since light emission cannot be extinguished until voltage between an individual electrode and conductor 100 is reduced to less than $V_s$, or 220 v. in the chosen example.

The scientific theory concerning such sustaining of light emission is well known. Briefly during light emission, capacitive charges are created in the walls of tube 101 adjacent each conducting electrode. These wall charges assist the firing with the lower sustaining voltage of each gas volume adjacent them during each reversal of potential between conductor 100 and the individual ones of electrodes 207–211. See U.S. Pat. No. 3,573,542 (Mayer et al.) for a detailed description of gas discharge display operation incorporating memory.

When it is necessary to reset the indication, switch 212 may be opened, removing sources 103 and 206 from electrodes 207–211 and extinguishing light emission adjacent them. Alternatively, it is also possible to extinguish light adjacent only a portion of all the electrodes. If source 206 is changed so that $V_3 = 175$ v. and source 103 changed so $V_2$ can vary from 0 to 100 v., the 50–100 v. range for $V_2$ can be used to sequentially light electrodes as $V_2$ increases and the 0–50 v. range can be used to sequentially extinguish light emission from electrodes as $V_2$ decreases from 50 v. We have determined that as little as 2 v. potential differences between adjacent electrodes can be employed and still reliably select the line of demarcation between conducting and non-conducting (lit and unlit) electrodes. Thus, from 20–25 electrodes may be effectively used when $V_t - V_s = 50$ v. The gap between adjacent electrodes should be such as to ensure a reasonably continuous light-emitting area. Experience shows that a certain amount of fringing of the light-emitting area within tube 101 will occur, so that an appreciable gap between electrodes may be tolerated without any break in the continuity of the light-emitting area. Preferred gap size is usually in the neighborhood of 0.01–0.1 inch.

Resistors 201–205 are each of different value, selected so that resistance between each individual electrode 207–211 and terminal 213 of source 206 is a constant. This means that resistor 202 must be greater than resistor 201 by the quantity of resistance in each resistor 200a–200d. The resistance of each resistor 203–205 is similarly greater than that of its right-hand neighbor. By so selecting resistors 201–205, approximately equal current will flow from each electrode 207–211, and equal intensity of light will result as well.

It is not necessary to employ discrete resistors 200a–200d to create the differing potential at each electrode 207–211. A continuous resistive conductor such as that of FIG. 1a also can be used to create the potential gradient along a side of tube 101 and still retain the memory characteristics of the display.

Figure 3:
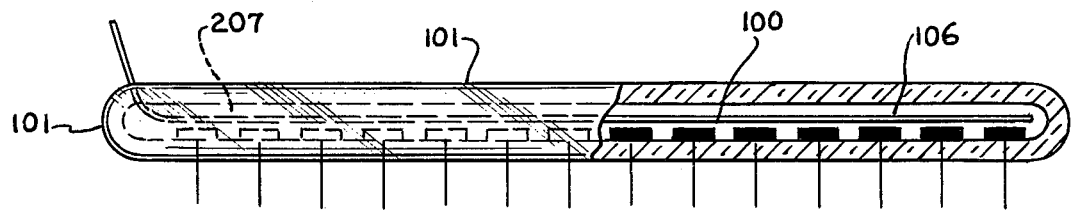
FIG. 3 is an alternative embodiment of the display element of FIGS. 1a and 2a having its ground conductor and electrodes physically located within the gas chamber of the display tube.

FIG. 3 disclosed a tube having a conductor 100 and electrode 207 and other electrodes all within and disposed on opposite sides of chamber 106. This tube can be used if power is to be supplied from continuous D.C. sources, in a circuit very similar to that of FIG. 2a. However, for D.C. operation no wall charge exists, and hence no appreciable difference between $V_t$ and $V_s$ exists, so no memory operation as with FIG. 2a is possible.

Figure 4:
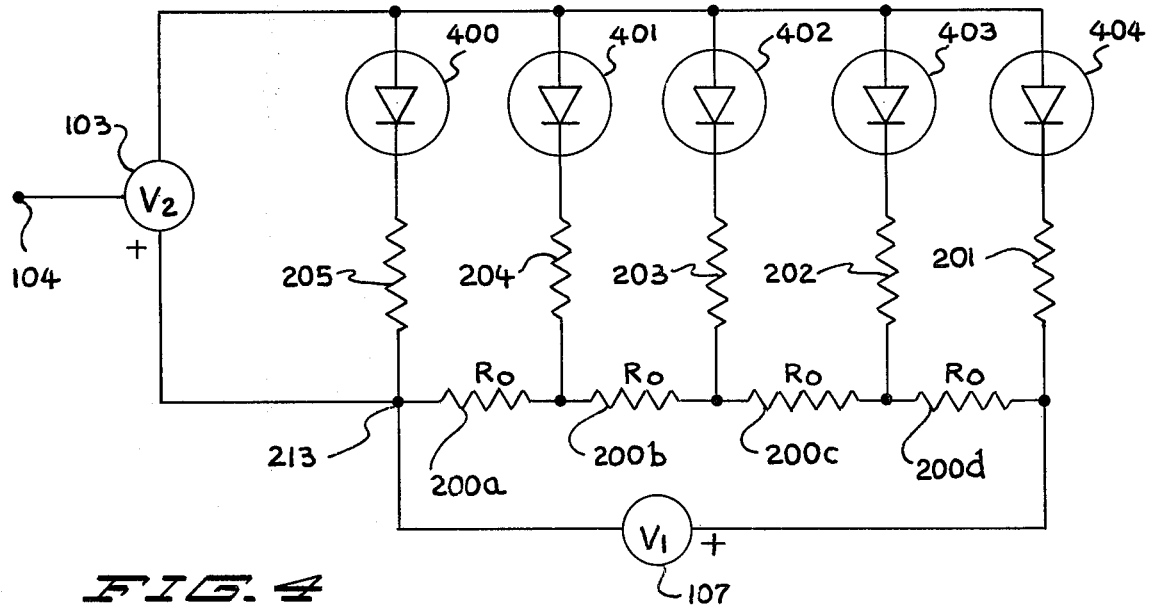
FIG. 4 is an alternative embodiment of FIG. 1a employing light-emitting diodes as the light source.

FIG. 4 displays an embodiment employing light-emitting diodes (LEDs) as the light emitting devices rather than a gas discharge tube. LEDs 400–404 are typical devices of the type, having predetermined forward voltage drops, which can be assumed to be 1.5 v. for the purposes of explanation. The interface zones of LEDs 400–404 from which light emission occurs responsive to a difference of voltage from one side to the other, can be made of discrete segments as shown, or continuous without affecting operating characteristics. If continuous, a continuous resistance, such as resistor 102 of FIG. 1a is more suitable to use therewith. Resistors 200–200d are all equal-valued as in the apparatus of FIG. 2a, and resistors 201–205 are chosen such that total resistance between the cathode of their associated diode 300–304 and terminal 213 is approximately equal. Because of the much smaller threshold voltage involved for diodes 400–404, voltage sources 103 and 107 may have a significantly smaller value, say on the order of 5–15 v. each. Resistors 201–205 should have values that current flow through their associated LEDs 400–404 will be the few milliamperes necessary to cause light emission.

Operation of this circuit is smaller to that of the circuit in FIG. 2a. As the signal at terminal 104 increases voltage of source 103, voltage between the cathode and the anode of diode 404 will increase until the forward diode drop is exceeded, at which time diode 404 commences light emission. As voltage across source 103 between is further increased, diodes 403, 402, 401, and 400 will successively break into light emission as their forward diode drops are successively exceeded. Since the sustaining voltage is identical here also to the threshold or forward voltage drop in these diodes, this circuit also does not have memory capabilities. Although only five LEDs 400–404 are shown the circuit can be designed to operate with a greater number by appropriately changing the voltages of sources 103 and 107 and changing the values of the resistances.

Throughout the previous descriptions, voltages have been shown as dropped by the use of resistances. When dealing with A.C. sources, any convenient impedance may be used to drop the voltages. It is only necessary that values be selected such that voltage phase relationships between conductors 100 and 102, and the cathodes and the anodes of FIG. 4, be maintained.

Having thus described our invention, what we claim is:

1. In an electronically powered threshold device light source of the type producing visible light from those segments of a two-sided interface zone therein across which a voltage difference in excess of a threshold value exists, an improvement for producing light from selected segments of the interface zone in a preselected order responsive to a control signal, and comprising:
   a. a conductor adjacent a first side of the interface zone, and having first and second points adjacent first and second segments of the interface zone respectively;
   b. an impedance adjacent a second said of the interface zone generally spaced across the interface zone from the first side, having first and second points adjacent the first and second segments respectively, and having appreciable impedance between its first and second points;
   c. a first voltage source of preselected value connected between the first and second points of the impedance; and
   d. a second voltage source connected between the conductor and the impedance, whose voltage output varies responsive to the control signal from a value creating a voltage difference between the first points of the conductor and the impedance at least equal to the threshold value, to a value simultaneously creating voltage differences between the first points of the conductor and the impedance and between the second points of the conductor and the impedance both at least equal to the threshold value.

2. The apparatus of claim 1, wherein the light source comprises a gas discharge element having a chamber containing an ionizable gas, and the conductors extend along and adjacent first and second opposing sides of the gas chamber.

3. The apparatus of claim 2, wherein the impedance comprises a plurality of series-connected second impedances, and a plurality of electrodes, each electrode connected to a second impedance terminal, placed adjacent the second side of the interface zone, and spaced apart from other electrodes.

4. The apparatus of claim 3, wherein the electrodes are positioned such that the voltage between the first point of the impedance and the various electrodes is greater for each electrode more remote from the first segment of the interface zone than for each electrode less remote therefrom.

5. The apparatus of claim 4, wherein the second voltage source is of the type whose voltage continuously increases while the control signal swings from one preselected value to another.

6. The apparatus of claim 3, wherein each electrode is spaced apart from each electrode adjacent it such that when it and an adjacent electrode are both conducting a substantially continuous area of light emission is formed.

7. The apparatus of claim 3, wherein each electrode includes an impedance.

8. The apparatus of claim 7, wherein each impedance comprising an electrode has a value causing current flow through it to be within a preselected range while its associated interface zone segment is producing light.

9. The apparatus of claim 2, wherein the impedance comprises between its first and second contact points a resistive element adjacent at least a portion of the second side.

10. The apparatus of claim 9, wherein the impedance comprises a resistive coating on a surface of the gas discharge element between its first and second points.

11. The apparatus of claim 2, wherein the gas discharge element is of the type whose threshold voltage exceeds a sustaining voltage below which light emission ceases, by a substantial amount when driven by A.C. voltage; wherein the first voltage source is of the A.C. type producing a potential less than the difference between the threshold and sustaining voltages and the second voltage source is of the A.C. type producing an output voltage which places the voltage difference between the conductor and the impedance along the entire interface zone between the threshold and sustaining voltages responsive to a predetermined control signal condition.

12. The apparatus of claim 11 wherein the second voltage source includes means for reducing its output voltage to a level placing the voltage differnce between the conductor and the impedance along at least a portion of the interface zone below the sustaining voltage responsive to a predetermined control signal partial erase condition.

13. The apparatus of claim 11, wherein the second voltage source includes means for reducing its output voltage to a level placing the voltage difference between the conductor and the impedance along the entire interface zone below the sustaining voltage responsive to a predetermined control signal erase condition.

14. The apparatus of claim 11, wherein the second voltage source is of the type whose voltage can vary continuously upwardly to a maximum voltage placing the voltage difference between each point of the conductor and that point of the impedance most nearly adjacent thereto, above the threshold voltage.

15. The apparatus of claim 11, wherein the interface zone comprises light-emitting diode material.

* * * * *